FREQUENCY COMPENSATED GAIN CONTROL CIRCUIT

Filed July 22, 1960

INVENTORS:
JOHN A. KLEIN,
SIEGFRIED J. ZUERKER,

BY Norman C. Fulmer
THEIR ATTORNEY.

United States Patent Office 3,195,067
Patented July 13, 1965

3,195,067

FREQUENCY COMPENSATED GAIN CONTROL CIRCUIT

John A. Klein and Siegfried J. Zuerker, Utica, N.Y., assignors to General Electric Company, a corporation of New York Filed July 22, 1960, Ser. No. 44,711
9 Claims. (Cl. 330—126)

This invention relates to gain control circuits, and particularly to frequency compensated gain control circuits for use in audio amplifiers. The invention provides an improved frequency compensated gain control circuit for use in either monaural or stereophonic amplifiers, and which is particularly advantageous when utilized in the balance control circuits of dual-channel stereophonic amplifiers.

An object of the invention to provide an improved frequency compensated gain control circuit having substantially uniform frequency response for various gain settings thereof.

Another object is to provide an improved balance control circuit for stereophonic amplifiers, which has substantially uniform frequency response characteristics for various balance settings thereof.

Further objects are to provide a frequency compensated gain control circuit that is relatively simple, compact, and inexpensive to manufacture.

Still other objects will be apparent from the following disclosure and claims, and from the drawing in which:

The invention comprises a circuit employing a potentiometer having a resistance element provided with a variable tap thereon for accomplishing gain control, and a frequency compensation network connected between the signal input end of the potentiometer and a point on the resistance element independently of the variable tap. The invention further comprises a balance control for use in stereophonic amplifiers, comprising a pair of the aforementioned frequency compensated gain control potentiometers respectively connected in two channels of the stereophonic amplifier and ganged together in such a manner that the gains of the two amplifiers will be varied in opposite directions when the balance control is actuated. Each of the balance control potentiometers is provided with the aforesaid frequency compensating network connected between the signal input thereof and a point on the resistance element thereof.

Since the present invention is particularly applicable to use in balance control circuits of stereophonic amplifiers, it will be particularly described for this application.

Figure 1:
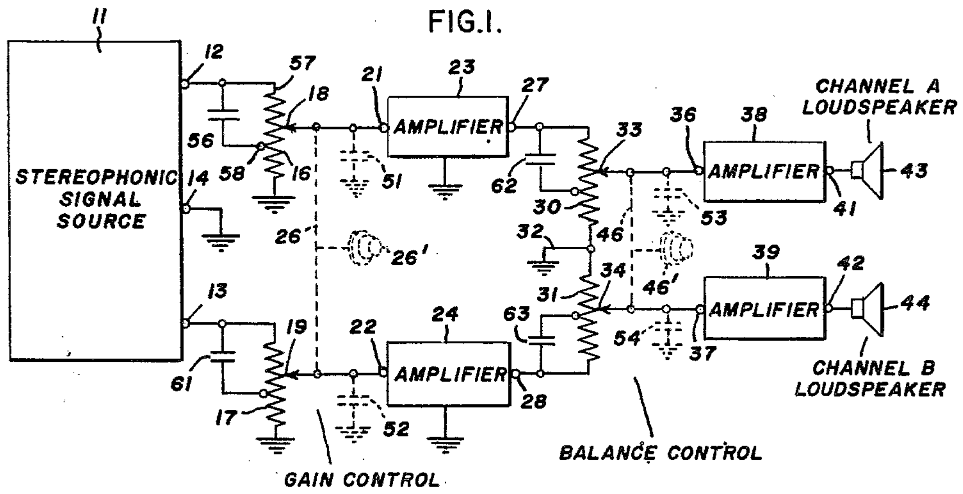
FIGURE 1 is an electrical diagram, partly in block form, of a stereophonic amplifier system in which a preferred embodiment of the invention is incorporated.

Now referring to FIGURE 1, a stereophonic signal source 11 provides a pair of stereophonic signals at the terminals 12 and 13, an electrical ground at terminal 14 being common for both signals. The signal source 11 may comprise a stereophonic phonograph pickup cartridge, either with or without preamplifier stages, or it may comprise a pickup head for moving tape, or one or more radio receivers arranged for stereophonic operation. The signal terminals 12 and 13 are connected to ends of the resistance elements of gain control potentiometers 16 and 17, respectively, these potentiometers being returned to the common terminal 14 by way of electrical ground, as shown. Adjustable taps 18, 19 on the resistance elements of the potentiometers 16 and 17 are connected electrically to input terminals 21, 22 of amplifiers 23, 24, respectively.

The adjustable taps 18, 19 are mechanically connected together, as indicated by the dotted line 26, preferably by means of a common rotatable shaft having a control knob 26' attached thereto in conventional manner. The gain control potentiometers 16 and 17 are ganged together in such a manner that they will simultaneously increase or decrease the gain by the same amount in both of the amplitude channels.

Output terminals 27, 28 of the amplifiers 23, 24 are respectively connected to ends of the resistance elements of a pair of balance control potentiometers 30, 31, these balance control potentiometers being returned to electrical ground as shown at 32. Adjustable taps 33, 34 on the resistance elements of the potentiometers 30 and 31 are connected respectively to input terminals 36, 37 of amplifiers 38 and 39, the output terminals 41, 42 of these amplifiers being respectively connected to loudspeakers or loudspeaker systems 43, 44.

For convenience, the term "channel A" is used to designate the amplifier channel comprising the potentiometers 16 and 30, the amplifiers 23 and 38, the loudspeaker 43. The term "channel B" is used to designate the amplifier channel comprising the potentiometers 17 and 31, the amplifiers 24 and 39, and the loudspeaker 44. The exact circuit location of the gain control and balance control is a matter of circuit design, and FIGURE 1 shows a preferred arrangement. Each of the amplifiers shown may comprise one or more stages of amplification.

The adjustable taps 33 and 34 of the balance control potentiometers 30, 31, are mechanically coupled together as indicated by the dotted line 46, this preferably being accomplished by means of a common rotatable shaft mechanically coupled to the adjustable taps 33 and 34, the shaft being adapted for manual rotation by means of a control knob 46' attached thereto. The mechanical coupling 46 is such that the balance control potentiometers 30 and 31 are adjusted in opposite directions of gain; i.e., the arrangement is such that when the coupling 46 is actuated in one direction it will move the adjustable taps 33 and 34 "upwardly" and the gain of "channel A" will be increased whereas the gain of "channel B" will be decreased. Similarly, when the mechanical coupling 46 is actuated to move the adjustable taps 33, 34 "downwardly," the gain of "channel A" will be decreased whereas the gain of "channel B" will be increased. Preferably, the balance control potentiometers 30 and 31 have logarithmic characteristic curves; for example, a 20% log taper is found desirable. The direction of the logarithmic taper is such that the values of resistance in the potentiometers vary relatively greater near the electrically grounded ends thereof.

The circuit of FIGURE 1, as thus far described, is the same as is shown and described in copending patent application Serial No. 840,622, filed September 17, 1959, and assigned to the same assignee as the present invention. The claims of the said copending patent application are directed to the balance control arrangement having nonlinear or logarithmic balance control potentiometers 30 and 31.

In the circuit of FIGURE 1 as thus far described, the gain control comprising the potentiometers 16 and 17, functions to set the gains of channels A and B to a desired value, this gain adjustment always providing, insofar as possible, equal values of gain in channels A and B at all times. The balance control potentiometers 30 and 31 are properly set, if the component parts of channels A and B are such that these channels inherently have equal gains, to the 50% rotation point with respect to electrical ground, at which setting both of the balance control potentiometers 30 and 31 provide equal attenuation of the signals in the channels A and B thereby resulting in a properly balanced system.

If, for example, channel A happens to provide greater gain than channel B, then the system would be balanced by setting the balance control, by means of the mechanical coupling 46, so that the potentiometer 30 would provide relatively more attenuation and the potentiometer 31 would provide relatively less attenuation. One such setting might be, for example, an adjustment whereby the potentiometer 30 would be set at 25% of its full rotation and the potentiometer 31 would be set at 75% of its full rotation.

It is well known that circuits employing gain control potentiometers, such as the elements 16, 17, 30, and 31 of the circuit of FIGURE 1, suffer a loss in high frequency response when the taps of these potentiometers are set at points less than for full gain. This is due to the fact that when the adjustable tap of the potentiometer is set at a point other than the signal input end of the resistance element, there results a resistance-capacitance filter which attenuates the higher frequencies. The resistive part of this filter comprises the resistance portion of the potentiometer between the signal input end thereof and the adjustable tap, and the capacitance comprises the inherent capacitance between the adjustable tap and electrical ground. This inherent capacitance comprises the sum of the input capacitance of the vacuum tube or other amplifier device contained in the amplifier to which the adjustable tap is connected, and stray capacitances between electrical wiring and ground. These capacitances are indicated in FIGURE 1 by dotted lines, at 51, 52, 53, and 54.

In accordance with the present invention, frequency compensation for the gain controls (including the gain controls employed in the balance control) comprises frequency compensating networks respectively connected between the signal input terminal and a tap on the resistance element of each potentiometer. Thus, the frequency compensation for the potentiometer 16 comprises a capacitor 56 connected between the signal input end 57 of the potentiometer 16 and a tap 58 intermediate the ends of the resistance element thereof. Similarly, capacitors 61, 62, and 63 are connected across a portion of the resistance element of each of the potentiometers 17, 30 and 31. The taps on the potentiometer resistance elements to which the corrective capacitor is connected, may be fixed taps as shown, although if desired these taps may be adjustable, these taps being additional to the variable taps which provide gain adjustment.

The exact value of the compensating capacitor, and the position of the tap to which it is connected on the potentiometer resistance element, are chosen with respect to the capacitance-to-ground at the adjustable output gain-control tap of the potentiometer so as to provide substantially uniform frequency response characteristics for all settings of the adjustable gain control tap. By way of example, if the value of the shunt capacitance 51 at the adjustable tap 18 of the potentiometer 16 is 75 mmf., and if the resistance of the potentiometer is five megohms and has a 20% logarithmic taper, then it is found desirable for the compensating capacitor 56 to have a capacitance of 50 mmf., and the tap 58 being located at the 50% rotation point of the potentiometer. Likewise, the compensating capacitors 61, 62 and 63 would have the same values of capacitance as does the capacitor 56 if the same conditions exist with respect to the shunt capacitance values 52, 53 and 54 and to the potentiometers 17, 30 and 31.

Figure 2:
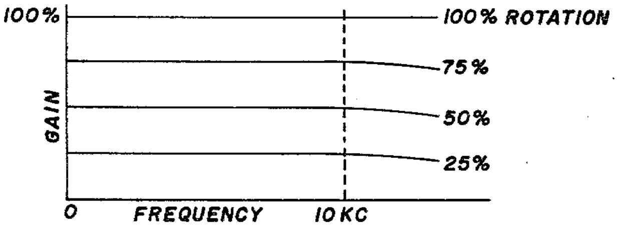
FIGURE 2 is a graphical presentation of frequency response curves of the gain control circuit of the invention.

FIGURE 2 shows typical frequency response characteristic curves achieved with a compensated gain control in accordance with the invention, from which it is seen that the frequency response is essentially uniform or "flat" to 10 kilocycles at various gain settings, and at frequencies higher than 10 kilocycles the response drops off only slightly.

Figure 4:
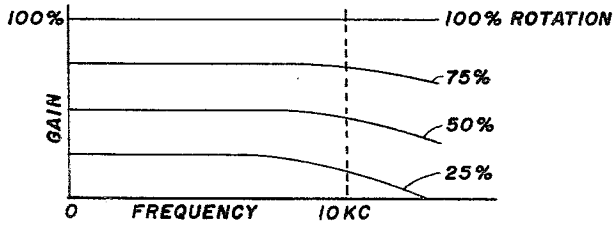
FIGURE 4 is a graphical presentation of frequency response curves of a typical gain control circuit known to the prior art and not embodying the present invention.

By way of comparison, FIGURE 4 shows gain control frequency response curves that would be had if the frequency compensating capacitors 56, etc. were omitted, and it will be seen that, without the frequency compensation of the invention, the frequency response at the higher frequencies becomes relatively poorer as the potentiometer tap is set toward its lower values of rotation, i.e., toward the electrically grounded end of the resistance element. This degradation of frequency response is caused by the fact that, at the lower rotational settings of the potentiometer, the portion of the resistance element of the potentiometer between the signal input end thereof and the adjustable tap thereon, becomes an appreciable value of series resistance in a high-frequency attenuation filter which includes the stray capacitance 51, etc. as a shunt capacitance element thereof.

The invention overcomes this objectionable effect, due to the fact that the compensating capacitor 56, etc. provides a path for the higher frequencies to reach the intermediate tap on the potentiometer, so that the higher frequencies are aided in reaching the gain-controlling adjustable output tap of the potentiometer at the lower-gain settings thereof.

Figure 3:
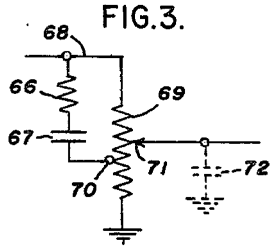
FIGURE 3 is a schematic circuit diagram of a modification of the embodiment of the invention shown in FIGURE 1.

In the modification of the invention shown in FIGURE 3, the frequency compensating network of the invention comprises a series-connected resistor 66 and capacitor 67, this series combination being connected between the signal input end 68 of the gain control potentiometer 69 and a tap 70 on the resistance element of the potentiometer, there being the usual adjustable tap 71 at which the gain-controlled output signal is obtained. The inherent stray capacitance in shunt with the tap 71, is indicated at 72. The modified arrangement of FIGURE 3 may be applied to any of the gain control or balance control potentiometers of FIGURE 1, and is useful under certain conditions for achieving improved uniformity of frequency response.

The improved frequency response achieved by the invention when applied to an amplifier gain control, results in a more pleasing and more faithful signal reproduction in an amplifier system for various settings of the gain control.

When applied to balance control potentiometers in stereo amplifiers, the invention achieves the additional desideratum of insuring equal frequency response characteristics for the two amplifier channels, at the different settings of the balance control. The importance of this will be readily appreciated by considering the frequency response curves of FIGURE 4, which represent the frequency characteristics of the individual balance control potentiometers 30 and 31 in the absence of the frequency compensating capacitors 62 and 63. When the adjustable taps 33 and 34 of these potentiometers are set at their nominal 50% position, the higher frequencies will be somewhat attenuated in both of the channels A and B, this attenuation being the same for both channels. However, when the balance control must be adjusted away from its 50% rotation point in order to achieve a desired balancing, for instance such that the potentiometer 30 is set at its 75% rotation and the potentiometer 31 is set at its 25% rotation, the frequency response characteristics of the two channels would be unbalanced. The reason for the unbalance will be readily appreciated from the curves of FIGURE 4, it being seen that the balance control potentiometer that is set at its 75% rotation point will cause only a slight attenuation of frequencies at 10 kilocycles and above, whereas the balance control potentiometer that is at its 25% setting, will cause an appreciable attenuation of frequencies at and above 10 kilocycles. Such an unbalanced frequency response characteristic of the two stereophonic channels cause an unpleasant effect to the listener.

As will be readily understood from the frequency response curves of FIGURE 2, when the frequency compensating capacitances 62, 63 of the present invention are provided, the balance control potentiometers 30 and 31 have substantially the same frequency response characteristics whether at their 25%, 50% or 75% rotation point, thus providing balanced frequency response characteristics for the two channels of the system regardless of the setting of the balance control.

Figure 5:
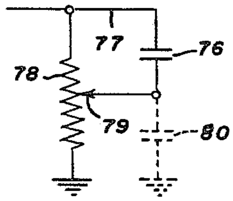
FIGURE 5 is a schematic diagram of a frequency compensated gain control circuit known to the prior art.
Figure 6:
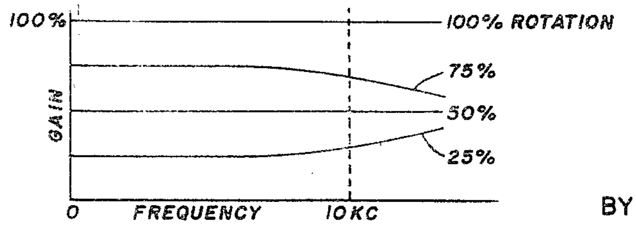
FIGURE 6 is a graphical presentation of frequency response curves of the prior art gain control circuit of FIGURE 5.

The invention is an improvement over a prior-art type of frequency compensation circuit shown in FIGURE 5, wherein a capacitor 76 is connected between the signal input end 77 of the gain control potentiometer 78 and the adjustable tap 79 thereof. The stray shunt capacitance is indicated by the numeral 80. The frequency response characteristic curves of this prior-art frequency-compensated gain control are shown in FIGURE 6, from which it will be seen that good frequency compensation is achieved at one setting, for example the 50% rotation point, because at this setting of the output tap 79, the impedance relations of the upper part of the potentiometer resistance and the capacitor 76, are exactly equal to the impedance relations of the lower part of the potentiometer resistance and the shunt capacitance 80. However, a shown in FIGURE 6, the high frequencies are attenuated at settings of the potentiometer above its point of good compensation, and the high frequencies are increased in magnitude at settings less than the point of good compensation. If such a frequency compensated arrangement were used as balance control potentiometers in a stereophonic amplifier, settings of the balance control other than the 50% setting, for example a setting of 75% on the A channel potentiometer and 25% on the B channel potentiometer, would result in attentuation of the higher frequencies in channel A and an increase in intensity of the higher frequencies in channel B, thereby causing an extreme and undesirable frequency unbalance of the system. Thus, the frequency compensated gain control circuit of the invention not only achieves improved frequency compensation over the prior art compensation circuit, but also is useful in a balance control circuit for stereophonic amplifiers, whereas the prior art compensation circuit is not entirely suitable for this use. The possibility has been considered of providing a variable capacitor for the capacitor 76 in FIGcurate frequency compensation at all settings of the potentiometer 78 and suitably tracked therewith to provide accurate frequency compensation at all settings of the potentiometer; however, such an expedient is difficult and costly to achieve, whereas the invention achieves the desired result in a simple and inexpensive manner.

While a preferred embodiment and modification of the invention have been shown and described, various other embodiments and modifications thereof will be apparent to those skilled in the art and will fall within the scope of the invention as defined in the following claims.

What we claim is:

1. A balance control circuit for a dual channel stereophonic amplifier adapted to receive stereophonically related signals respectively at signal inputs of said channels, comprising a pair of potentiometers respectively connected in each of said channels for controlling the gain thereof, each of said potentiometers having a resistance element provided with a variable tap thereon, means to apply the signal of each channel to a first end of the resistance element of the respective potentiometer in the channel, signal return means connected to the remaining ends of said resistance elements, means for adjusting said variable taps simultaneously in opposite directions of gain control, there being a capacitance between each of said variable taps and said signal return means which tends to cause an unbalanced change in the frequency responses of said channels when said variable taps are adjusted to achieve balanced gains for said channels, and a pair of frequency compensation networks respectively connected to each of said resistance elements between the first end thereof and a point thereon between the ends thereof independently of said variable tap, said frequency compensation networks having frequency characteristics to compensate for said unbalanced change in frequency responses in said channels thereby providing substantially identical frequency responses for said channels for all settings of said balance control.

2. A circuit as claimed in claim 1, in which each of said frequency compensation networks comprises a capacitor.

3. A circuit as claimed in claim 1, in which each of said frequency compensation networks comprises a resistor and a capacitor connected in series.

4. A frequency compensated gain control circuit comprising a potentiometer having a resistance element provided with a variable tap thereon, a signal input connection at a first end of said resistance element, signal return means connected to the remaining end of said resistance element, there being an inherent and stray capacitance between said variable tap and said signal return means which tends to cause a change in the frequency response of said gain control circuit when said variable tap is at different positions on said resistance element, and a frequency compensation network connected between said first end of the resistance element and a point on said resistance element between the ends thereof independently of said variable tap, said frequency compensation network including at least one electrical component having a value and said point being selected such that they compensate for the change in the frequency response of said gain control circuit so as to provide a substantially uniform frequency response for said circuit when said variable tap is at different positions on said resistance element.

5. A circuit as claimed in claim 4, in which said frequency compensation network comprises a capacitor.

6. A circuit as claimed in claim 4, in which said frequency compensation network comprises a series combination of a capacitor and a resistor.

7. A balance control circuit for a dual channel stereophonic amplifier adapted to receive stereophonically related signals respectively at signal inputs of said channels, comprising a pair of potentiometers respectively connected in each of said channels for controlling the gain thereof, each of said potentiometers having a resistance element provided with a variable tap thereon, means to apply the signal of each channel to a first end of the resistance element of the respective potentiometer in the channel, signal return means connected to the remaining ends of said resistance elements, means for adjusting said variable taps simultaneously in opposite directions of gain control, there being an inherent and stray capacitance between each of said variable taps and said signal return means which tends to cause an unbalanced change in the frequency responses of said channels when said variable taps are adjusted to achieve balanced gains for said channels, and a pair of frequency compensation networks respectively connected to each of said resistance elements between the first end thereof and a point thereon between the ends thereof independently of said variable taps, said frequency compensation network including at least one electrical component having a value and said point being selected such that they compensate for the change in the frequency response so as to provide a substantially uniform frequency response for said gain control circuit when said variable tap is at different positions on said resistance element.

8. A circuit as claimed in claim 7, in which each of said frequency compensation networks comprises a capacitor.

9. A circuit as claimed in claim 1, in which each of said frequency compensation networks comprises a resistor and a capacitor connected in series.

References Cited by the Examiner

UNITED STATES PATENTS

| | | | |
|---|---|---|---|
| 1,938,257 | 12/33 | Jacobs | 333—28 |
| 2,029,523 | 2/36 | Curtis | 333—28 |
| 2,037,753 | 4/36 | Barton | 333—28 |
| 2,065,344 | 12/36 | Newton | 333—28 |
| 2,069,853 | 2/37 | Schade | 333—28 |
| 2,101,832 | 12/37 | Barton | 333—28 |
| 2,121,150 | 6/38 | Jarvis | 333—28 |
| 2,144,565 | 1/39 | Breisbach | 333—28 |
| 2,212,389 | 8/40 | Chorpening | 333—28 |
| 2,256,072 | 9/41 | Bruck | 333—28 |
| 2,474,191 | 6/49 | Reid et al | 333—28 |
| 2,500,493 | 3/50 | Holst | 333—28 |
| 2,657,363 | 10/53 | Broos | 333—28 |
| 2,680,232 | 6/54 | Claras | 333—28 |
| 3,036,158 | 5/62 | Romano | 330—155 |

OTHER REFERENCES

Langford-Smith-Radiotron Designer's Handbook, 4th Edition, 1952, Page 639.

HERMAN KARL SAALBACH, *Primary Examiner.*

BENNETT G. MILLER, *Examiner.*